United States Patent [19]

Chatterjee et al.

[11] Patent Number: 4,545,034

[45] Date of Patent: Oct. 1, 1985

[54] CONTACTLESS TITE RAM

[75] Inventors: Pallab Chatterjee, Richardson; Hisashi Shichijo, Garland; John E. Leiss, Carrollton, all of Tex.

[73] Assignee: Texas Instruments Incorporated, Dallas, Tex.

[21] Appl. No.: 505,157

[22] Filed: Jun. 17, 1983

[51] Int. Cl.[4] .............................................. G11C 11/40
[52] U.S. Cl. .................................... 365/182; 365/185; 357/41
[58] Field of Search ................................ 365/103–104, 365/174, 182, 184, 185; 357/41, 45; 307/575

[56] References Cited

U.S. PATENT DOCUMENTS 4,105,475  8/1978  Jenne ..................................... 365/182
4,380,804  4/1983  Lockwood et al. ................. 365/184

Primary Examiner—Terrell W. Fears
Attorney, Agent, or Firm—Robert Groover; James T. Comfort; Melvin Sharp

[57] ABSTRACT

A transversly injected quasi-floating gate memory cell. A memory transistor in bulk silicon has a channel region in bulk silicon which is capacitatively coupled both to a thin polysilicon quasi-floating gate and to an overlying word line. The thin polysilicon level which comprises the floating gate is not coterminous with the channel region of the memory transistor, but the quasi-floating gate portion of the thin polysilicon layer is connected, through a polysilicon channel region, to a write bit line. The overlying word line thus addresses both the write transistor in a thin polysilicon level and also the memory transistor itself in the substrate.

6 Claims, 5 Drawing Figures

CONTACTLESS TITE RAM

BACKGROUND AND SUMMARY OF THE INVENTION

The present invention relates to a semiconductor random access memory cell.

The classic one-transistor dynamic RAM cell, around which memory development has been centered from the 1K bit level up to the 256K bit level, has barriers to scalability which prevent scaling this technology beyond approximately the 1 megabit level. In particular, the specific capacitance of bit lines per unit length ceases to decrease with decreasing bit line geometries, due to fringing field effects. Thus, the quantity of charge stored in a single-transistor memory cell cannot be scaled further, without encountering disastrous effects of vulnerability to alpha-particle induced error and slow read speed.

To avoid this barrier to scaling, various attempts have been made to provide a memory cell which has high density and also has gain in each memory cell. It is also highly desirable that such a memory cell should have reasonably long storage times and reasonable process simplicity.

Thus, it is an object of the present invention to provide a random access memory cell having high density, reasonably long refresh times, and simple fabrication process requirements.

The present invention meets these objectives. The present invention teaches a memory cell which requires only double poly, and requires no metal in the cell itself. (Thus, the designer can use a metal level for, e.g., array architectural features such as segmented bit lines.) Thus, the present invention provides a highly planar memory cell which can be very simply fabricated.

The present invention uses an EPROM-like memory transistor, having source, drain, and channel on the substrate. This transistor is controlled by two gates: a quasi-floating gate composed of thin polysilicon, and a control gate in a second polysilicon layer. The quasi-floating gate is selectively isolated by a polysilicon-channel write transistor. This write transistor comprises a more lightly doped portion of the same polysilicon level which also constitutes the quasi-floating gate. A word line provides both the control gate for the memory transistor and the gate for the polysilicon-channel write transistor.

Thus, in the present invention, the read cycle is a destructive read, so that a write after read (as in the standard DRAM technology) is always necessary. However, because the gain of the memory transistor is greater than the gain of the write transistor, a good read with gain is provided nevertheless.

It should also be noted that the memory cell of the present invention is not exposed to alpha particle induced upset as are most memory cells. Since the store charge which constitutes the signal is stored in an isolated polysilicon layer, carriers generated in the substrate cannot be swept into the stored charge region. Moreover, since the read operation has high gain, a large read signal is provided from a small stored charge. Thus the storage area can have minimum lithographic dimensions, and the cell scales to extremely small dimensions conveniently.

According to the present invention there is provided:
A memory cell comprising:

a semiconductor substrate;

a read bit line in said substrate having a second conductivity type;

a drain voltage line in said substrate having a second conductivity type;

a memory transistor channel region at the surface of said substrate, separating said read bit line from said drain voltage line;

a word line defining a gate above and capacitatively coupled to said memory transistor channel region; and a thin polysilicon layer, said thin polysilicon layer comprising a quasi-floating gate portion thereof interposed between said word line and said channel region of said memory transistor and capacitatively coupled both to said word line and said channel region of said memory transistor, and said thin polysilicon layer also comprising a polysilicon channel region, said thin polysilicon channel region comprising a dopant concentration which is less than $10^{19}$ per cubic cm, said thin polysilicon channel region being capacitatively coupled to said word line, and said thin polysilicon layer also comprising a heavily doped write bit line portion, said polysilicon channel portion of said thin polysilicon layer being interposed between said write bit line portion and said quasi-floating gate portions respectively of said thin polysilicon layer, said quasi-floating gate having said second conductivity type.

BRIEF DESCRIPTION OF THE DRAWINGS

The present invention will be described with reference to the accompanying drawings, wherein.

DESCRIPTION OF THE PREFERRED EMBODIMENTS

Figure 1:
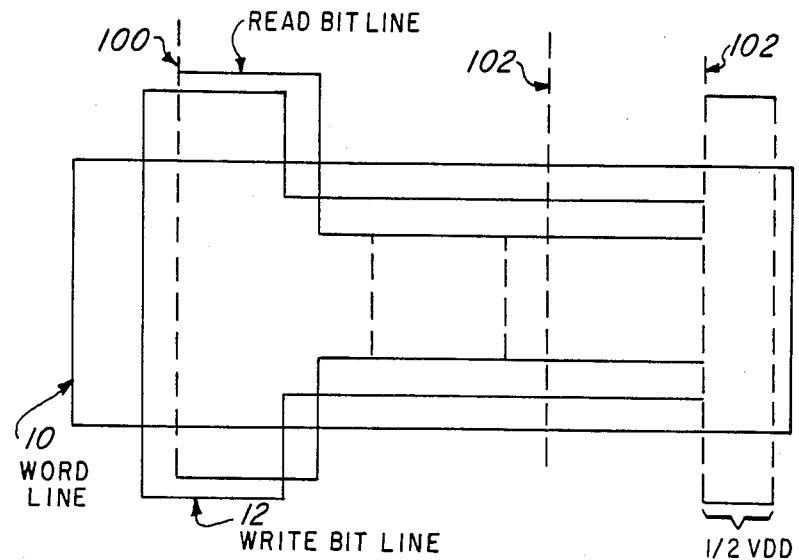
FIG. 1 shows a plan view of the layout of the memory cell according to the present invention.
Figure 2:
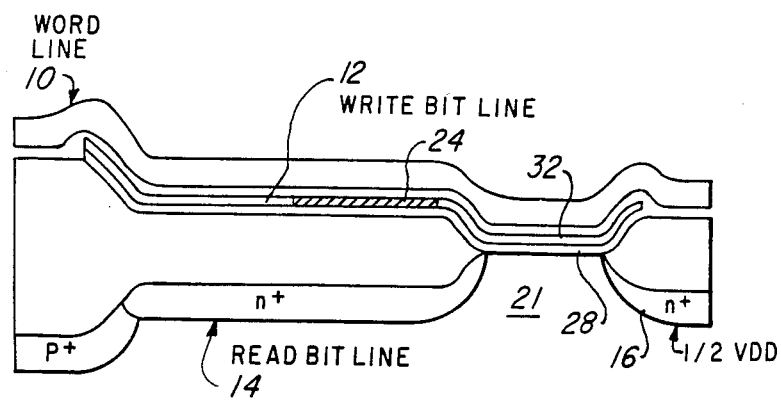
FIG. 2 shows a sectional view of a sample embodiment of the memory cell of the present invention.

FIGS. 1 and 2 show an embodiment of the memory cell of the present invention. A memory transistor 20 comprises a monocrystalline channel region 21 which separates a read bit line diffusion 14 from a drain voltage diffusion 16. A quasi-floating gate 32 is separated from the memory transistor 20 by a first gate oxide 28. Note that the thin polysilicon layer 26 contains not only the quasi-floating gate region 32, but also a polysilicon channel region 24 and a write bit line 12. The thin polysilicon channel region 24 is doped to, e.g., $5 \times 10^{16}$ through $10^{18}$ per cubic cm n-type, and the remainder of the polysilicon layer is doped to saturation, i.e., in the neighborhood of several times 10 to the 21 per cubic cm n-type. The write bit line 12, which is a part of the thin polysilicon layer 26, has a resistance which is not low enough for a very large memory chip, such as one megabit or four megabit. Thus, the write bit line 12 is preferably strapped with a metal line. That is, a metal via would be patterned at intervals of, e.g., every 16 memory cells in a column, at which intervals the right bit line 12 would be connected to the strapping metal bit line. This expedient, as is well known to those skilled in the art, serves merely to reduce the resistance between the sense amplifier and the farther memory cells.

In a further embodiment of the invention, the write bit line 12 is cladded with a refreactory metal silicide to lower its sheet resistance. For example, by depositing titanium over this portion of the thin first poly layer and direct-reacting it to form titanium silicide a 1500 angstrom layer of poly is silicided to have a sheet resistance of less than 5 ohms per square (before hydrogen passivation). This embodiment is slightly preferable to using a metal line for bit line strapping, since this permits the metal level to be reserved for other purposes. For example, as is also well known in the art, this technique can be further adapted to use segmented bit lines, that is, in an array having a size of 1024 by 1024, pass transistors could be used at large intervals so that the memory cells themselves were connected to the actual sense amplifier only in groups of (e.g.) 16 cells at a time.

The word line 10 is preferably configured in second polysilicon. This polysilicon layer is a more normal polysilicon layer in thickness and doping. That is, the word line would typically be 5000 Angstroms thick and doped to a sheet resistance of less than 20 ohms per square. Of course, the word line 10 could be made of silicide, metal, or polycide instead. The word line 10 is closely coupled to the channel region 21 of the memory transistor 20, so that the word line 10 functions as the control gate of memory transistor 20. Typically the thickness of the second gate oxide 30 will be in the neighborhood of 100-500 angstroms.

Each pair of columns of cells are formed in a single moat, and these moats are separated by thickfield oxide portions 18, of 5000-6000 angstroms thickness. In addition, an intermediate oxide 22 of about 1000 angstroms thickness is used inside the moat regions, for all locations except the active areas of the respective memory transistors 20. The thickness of this intermediate oxide is not at all critical, except that if this oxide is made too thin the total power requirements would be raised (due to increased bit line capacitance).

The fabrication of this embodiment of the present invention will now be described in greater detail. It should be noted that the processing details which follow are provided merely as illustrative of the presently preferred best mode of practicing the invention, and are not by any means necessary to the present invention. As will be obvious to those skilled in the art, an immense range of modifications and variations, affecting essentially all of these processing parameters, is possible.

First, the moat regions are patterned, channel stops are implanted, and the field oxide 18 is grown, according to conventional locos technology. The moat mask 100 is shown in FIG. 1. Since each moat contains two whole columns of memory cells, only the left edge of the moat mask appears in FIG. 1. Again, it should be noted that the use of locos isolation is by no means necessary to the present invention, and any of the numerous other isolation techniques which are candidates to replace locos in integrated circuit processing may be substituted.

Next, a buried N+ oxidation step is performed. The mask 102 also runs for essentially the whole length of a column of memory cells, and separates the drain voltage lines 16 from the read bit line diffusion 14. Everywhere that the mask 102 is crossed by a word line 10, a memory transistor 20 is defined. This mask 102 is used to define a second local oxidation step. That is, an oxide/nitride layer is deposited within the area defined by mask 102, and the intermediate oxide 22 is then grown, e.g. to 1000 angstroms, over all other areas of the moat. (Of course, the thickness of thick field oxide 18 will also be increased slightly at this time.) An N+ implant is performed prior to growth of the intermediate oxide 22, to define the read bit line 14 and drain voltage diffusion 16. These implants are activated during the oxidation step which grows the intermediate oxide 22. Again, the intermediate oxide 22 does not have to be defined by locos methods, although for this second oxide patterning step locos does have the advantage that the sloped sidewalls produced provide excellent control of the topography which will underlie the thin polysilicon layer 26 between the channel region 24 and the quasi-floating gate region 32 over memory transistor 20. Locos also provides convenient self-alignment of the intermediate oxide to the active region.

A VT adjust implant is now preferably performed to adjust the threshold voltage of memory transistor 20 as desired.

The first gate oxide 28 is then grown over the channel regions 21 of the memory transistors 20, to a thickness of e.g., 100-300 angstroms.

The thin polysilicon layer 26 is then deposited (preferably immediately after the gate oxidation step). In the presently preferred embodiment, the thickness of thin poly layer 26 is 1500 angstroms, but this may be varied.

A polysilicon transistor threshold implant is then performed. This implant will define the dopant concentration of the polysilicon channel region 24. Preferably an arsenic implant at an energy of around 150 keV is performed at a dose in the neighborhood of 5 E12 per square cm. (This results in a dopant concentration in the polysilicon channel region 24 which is in the neighborhood of $10^{17}$ per cubic cm.) Next, the interlevel oxide 30 is preferably deposited, e.g., 2000 angstroms of low pressure CVD oxide, and photoresist is then patterned according to a mask 104 to define the channel regions 24. Heavy doping is then applied to the thin polysilicon layer 26 outside the channel regions 24, e.g., by $POCl_3$ doping. The thin polysilicon layer 26 is then patterned.

At this point the device is preferably passivated in hydrogen. The hydrogen passivation provides greatly improved characteristics in the polysilicon transistor. The dangling bonds which cause traps at the grain boundaries are saturated with hydrogen, and thus the mobility of the device is increased and the leakage current of the device is greatly decreased.

The hydrogen passivation can be accomplished in a variety of ways. In the presently preferred best mode, the devices are placed in a conventional plasma reactor, with a hydrogen pressure of 1 Torr and exposed for 60 minutes at a temperature of 300° C. to a plasma in the hydrogen. This provides an atomic hydrogen anneal, i.e. hydrogen ions diffuse into the silcon to bind to dangling bonds at grain boundaries.

Subsequent processing is unaffected by this hydrogen passivation step, except that it is desirable to avoid prolonged high temperature steps thereafter. Prolonged high-temperature steps are likely to cause the hydrogen at the grain boundaries to recombine and escape as molecular hydrogen, thus losing the passivation effect and degrading the mobility of the polysilicon transistor. However, this degradation is gradual rather than catostrophic, and a moderate amount of processing at moderate temperatures can easily be tolerated. (e.g. 1 hour at 400° or 500° C.)

A second gate oxide 30 is then grown, and the second polysilicon layer 10 is deposited, doped, and patterned. Processing thenceforth is entirely conventional, and continues with contact etch, metallization, etc. Note, however, that, as noted above, it is preferable not to expose the thin polysilicon layer 26 to subsequent high temperature steps, therefore, later steps such as normal high-temperature PSG reflow should be avoided. This can be done by using low-temperature glasses or organic materials for multi-level oxide under a metal layer, or by using transient heating to reflow the multi-level oxide.

In the presently preferred embodiment, OCD is used as the multilevel oxide. That is, OCD (a widely available organic solution of silicate glass) is spun on and baked at low temperature to evaporate the organic solvent. Optionally, this may be done in vacuum, to reduce the bake time. Processing thereafter continues with conventional stages of contact etch metal deposition, metal etch, and protective overcoat deposition and etch.

Note that, due to the temperature sensitivity of the hydrogen-passivated polysilicon, the contact sintering step (using aluminum doped with 1% silicon) is preferably limited to 10 minutes at 400° C., although this is not strictly necessary.

It should also be noted that where siliciding is used on a thin polysilicon layer, the silicide should be annealed before the hydrogen passivation step, so that high temperature processing required by the silicide does not drive out the hydrogen from the grain boundaries.

Figure 3:
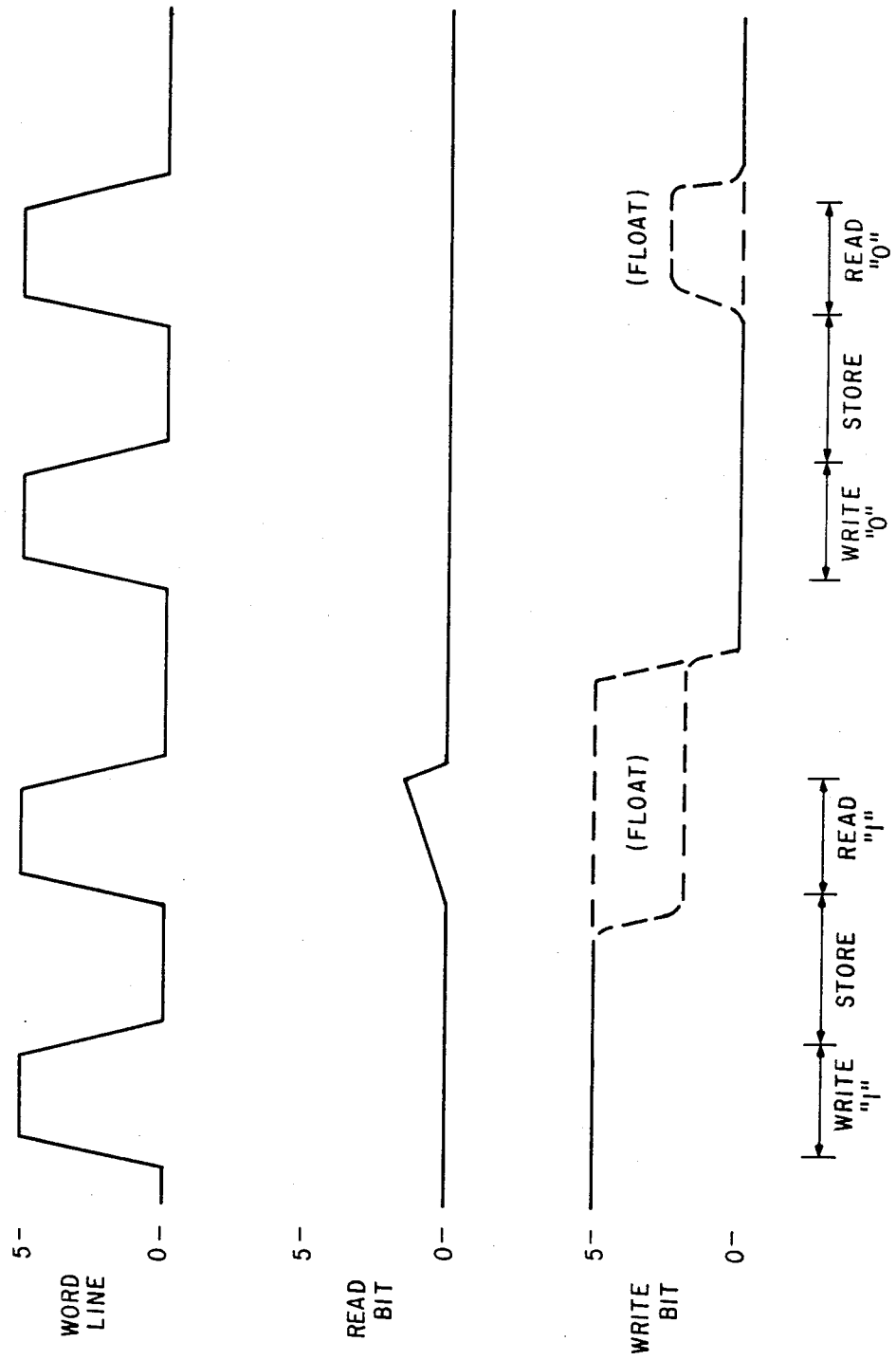
FIG. 3 shows the sequence of applied voltages corresponding to read and write of the two states of the memory cell of the present invention.
Figure 4:
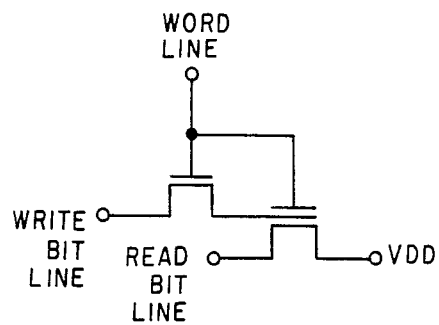
FIG. 4 shows an equivalent circuit diagram of the memory cell of the present invention.

FIG. 3 shows the signal levels seen in reading and writing the two states of the memory cell. Since the memory cell itself has high gain, the requirements of sense amplifier design are not demanding.

It is an important feature of the present invention that both the write transistor and the memory transistor have the same polarity, i.e. both are NMOS, since both are addressed by the word line.

When a "1" is to be written, the word line is brought up, which opens the write transistor. This means that the voltage applied to the write bit line (5 volts in this case) is injected into the quasi-floating gate portion of the thin polysilcon layer. The word line is then brought back down to zero, and the turn-off of the write transistor traps the stored charge in the quasi-floating gate.

Note that the read line is preferably held at zero volts (i.e. is clamped by a stage in the peripheral circuitry) at all times except when a read operation is actually being performed. This averts the problem of leakage through other transistors on the same bit line.

When a read operation is to be performed, the word line is again brought up to address the cell. This opens the memory transistor, but it also opens the write transistor, and therefor the stored charge on the quasi-floating gate begins to leak out. However, the memory transistor has a substantially higher gain than the write transistor, since the memory transistor has the much higher mobility of bulk silicon. Therefore, the read line will be brought up during the read cycle, by at least a few hundred millivolts.

The write bit line is preferably floated during a read cycle. It would be desirable to set a write line potential to some intemediate voltage, e.g. 2.5 volts, and then float it before the read cycle, but this would involve a substantial additional burden on the peripheral circuitry, and is believed not to be justified.

Thus, when a "1" is to be read, the memory transistor turns on and provides a current pulse into the read bit line, which can be detected by a sense amplifier.

When a "0" is to be written, the word line is again raised to open the write transistor, and the write bit line is clamped to fix the potential of the quasi-floating gate. Again, it should be noted that the read bit line is preferably held at 0 during all write operations to avoid disturbance of nonselected transistors. During the read operation, the write bit line is again floated while the word line is brought up, but this time the lack of stored charge in the quasi-floating gate means that the memory transistor is not turned on since its threshold voltage (as seen from the word line) is higher than 5 volts. Thus, the read bit line stays at 0 volts, and the sense amplifier triggers on this condition.

Of course, it is always necessary to have a write cycle immediately after a read cycle, since the read operation is destructive.

In the presently preferred embodiment, the memory transistor and the write transistor both have threshold voltages of about 2 volts, although these parameters can be varied.

Figure 5:
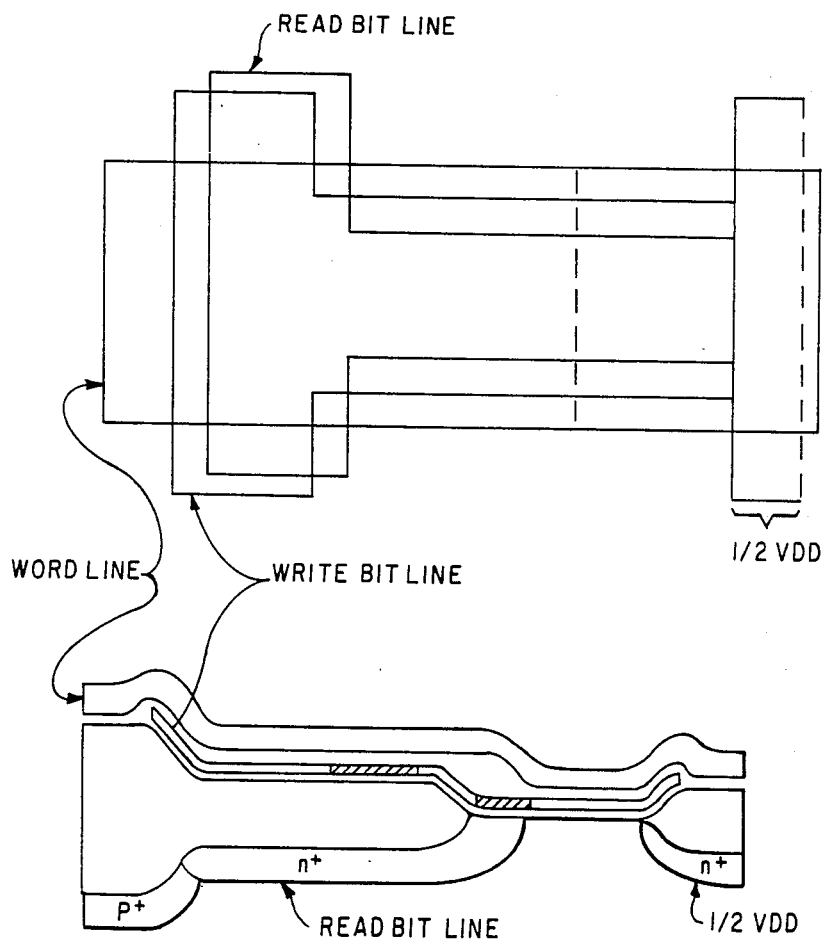
FIG. 5 shows a further embodiment of the invention, wherein the read operation is nondestructive.

A further embodiment of the present invention is shown in FIG. 5. This embodiment includes an additional polysilicon transistor, in series with the write transistor. This transistor provides a nondestructive read operation, since, in effect, the information being read out of the cell is immediately fed back to control this series read-project polysilicon transistor. Note that, where this embodiment of the invention is used, the write bit line should be held at volts during every read operation. That is, the read-protect transistor will be open only when the memory transistor has been opened, i.e. when a "1" has been read, so that the write bit line should be held at a voltage which will rewrite a "1" when the read product transistor is open. Similarly, the read bit line must be held high during every write operation to open the read-protect transistor.

However, this embodiment is substantially more difficult to fabricate. Note that it is no longer possible to use a single mask level to define the n+ implants for the read bit line and supply voltage lines and also to pat on the intermediate oxide. This embodiment is therefore not preferred, but is within the scope of the present invention.

As will be obvious to those skilled in the art, the present invention can be practiced in a wide range of modifications and variations, and is not limited except as specifically set forth in the following claims.

What is claimed is:
1. A memory cell comprising:
a semiconductor substrate;
a read bit line in said substrate having a second conductivity type;
a drain voltage line in said substrate having a second conductivity type;
a memory transistor channel region at the surface of said substrate, separating said read bit line from said drain voltage line;
a word line defining a gate above and capacitatively coupled to said memory transistor channel region; and
a thin polysilicon layer, said thin polysilicon layer comprising a quasi-floating gate portion thereof interposed between said word line and said channel region of said memory transistor and capacitatively coupled both to said word line and said channel region of said memory transistor, and said thin polysilicon layer also comprising a polysilicon channel region, said thin polysilicon channel region comprising a dopant concentration which is less than $10^{19}$ per cubic cm, said thin polysilicon channel region being capacitatively coupled to said word line, and said thin polysilicon layer also comprising a heavily doped write bit line portion, said polysilicon channel portion of said thin polysilicon layer being interposed between said write bit line portion and said quasi-floating gate portions respectively of said thin polysilicon layer, said quasi-floating gate having said second conductivity type.

2. The memory cell of claim 1, wherein said thin polysilicon layer is less than 2000 Angstroms thick.

3. The memory cell of claim 1, wherein said polysilicon channel region comprises a dopant concentration which at least $10^{17}$ per cubic cm.

4. The memory cell of claim 1, wherein said thin polysilicon layer additionally comprises a read protect transistor said read to protect transistor comprising a second polysilicon channel region capacitatively coupled to said read bit line laterally interposed between said quasi-floating gate portion and said first said polysilicon channel region.

5. The memory cell of claim 1, wherein said semiconductor substrate comprises silicon and has a first conductivity type opposite said second conductivity type.

6. A memory array comprising a plurality of memory cells of claim 1.

* * * * *